US005970395A

United States Patent [19]

Weiler et al.

[11] Patent Number: 5,970,395

[45] Date of Patent: Oct. 19, 1999

[54] APPARATUS AND METHOD FOR DETECTING AN INTERFERENCE RADIATION ON BOARD OF AN AIRCRAFT

[75] Inventors: Werner Weiler, Colomiers, France; Michael Krumbholz, Horst; Fred Hildebrandt, Buchholz, both of Germany

[73] Assignee: DaimlerChrysler Aerospace Airbus GmbH, Hamburg, Germany

[21] Appl. No.: 08/896,893

[22] Filed: Jul. 18, 1997

[30] Foreign Application Priority Data

Jul. 18, 1996 [DE] Germany .......................... 196 28 918

[51] Int. Cl.[6] .................................................. H04B 17/00

[52] U.S. Cl. ........................................................ 455/67.3

[58] Field of Search ................................ 455/67.1, 67.3, 455/456, 457, 501, 63, 132, 150.1, 431

[56] References Cited

U.S. PATENT DOCUMENTS

| | | | |
|---|---|---|---|
| 3,614,600 | 10/1971 | Ronka . | |
| 4,609,866 | 9/1986 | Loftness | 455/67.3 |
| 5,300,879 | 4/1994 | Masuda et al. . | |
| 5,499,388 | 3/1996 | Song | 455/67.3 |
| 5,543,779 | 8/1996 | Aspesi et al. | 455/67.3 |
| 5,649,303 | 7/1997 | Hess et al. | 455/67.3 |

FOREIGN PATENT DOCUMENTS

| | | |
|---|---|---|
| 3344798 | 7/1985 | Germany . |
| 4329130 | 3/1995 | Germany . |

*Primary Examiner*—Paul Loomis

*Attorney, Agent, or Firm*—W. F. Fasse; W. G. Fasse

[57] ABSTRACT

An apparatus for detecting high frequency interference radiation signals, such as radio frequency emissions, on board a passenger aircraft includes at least two receiver units for receiving and measuring the interference radiation signal, and a monitoring unit for evaluating the signal measurement results. Each receiver unit respectively includes at least one antenna, the monitoring unit includes an interference computer, and a digital data signal transmission path connects the receiver units to the monitoring unit. The interference computer evaluates the data signals received from the receiver units to determine the location of an interference radiation source within the aircraft, and indicates corresponding location and warning information on a display unit connected to the interference computer.

13 Claims, 3 Drawing Sheets

APPARATUS AND METHOD FOR DETECTING AN INTERFERENCE RADIATION ON BOARD OF AN AIRCRAFT

FIELD OF THE INVENTION

The invention relates to an apparatus for detecting a high frequency interference radiation, such as radio frequency (RF) emissions, on board an aircraft, particularly a passenger aircraft. The invention further relates to a method of operating such an apparatus.

BACKGROUND INFORMATION

The on-board electronic systems in an aircraft, such as the radio communication and control systems, are increasingly based on complex electronic circuits carrying out complex electronic processes. For this reason, it is technically necessary and required by various regulations, to quickly detect and disable or otherwise avoid interference radiations such as RF emissions that could possibly interfere with the proper operation of the on-board electronic systems. In passenger aircraft, such interference radiation is primarily generated by portable electronic devices, for example including electronic games, CD-players, portable computers and portable telephones, which are carried by the passengers and used on board the aircraft.

While some of such electronic devices may be safely used without generating harmful interference radiation, other such devices generate unacceptable or dangerous frequencies or signal strengths of interference radiation. The prior art has not provided an effective system for detecting and evaluating interference radiation signals, distinguishing between acceptable signals and unacceptable signals, and locating the source of such an interference radiation signal within the aircraft, so that the flight crew personnel can request that a particular offending electronic device be switched off by the passenger using it.

SUMMARY OF THE INVENTION

In view of the above, it is the aim of the invention to provide an apparatus for detecting an interference radiation on board an aircraft, which avoids the above discussed problems and disadvantages arising in the prior art. More particularly, the invention provides an apparatus that aims to monitor the pertinent frequency bands for such interference radiation signals that may interfere with the proper function of the aircraft electronic systems, and aims to identify or locate the respective source of the interfering radiation signal based on the interference signals received by the apparatus. The apparatus further aims to achieve advantages evident from the following description.

The above objects have been achieved in an apparatus for detecting a high frequency radiation, such as RF emissions, on board an aircraft and particularly a passenger aircraft, comprising a monitoring unit, at least one receiver unit connected to the monitoring unit via a digital data transmission pathway, and at least one display unit connected to the monitoring unit. Each receiver unit respectively includes at least one antenna adapted to receive interference radiation signals, and the monitoring unit includes an interference computer adapted to evaluate the interference signal data received from the at least one receiver unit.

The apparatus preferably comprises a plurality of receiver units, so that the interference computer can determine the location of the source of the interference radiation relative to the several receiver units by comparing and relatively evaluating the data signals provided by the receiver units. Optionally, at least one receiver unit includes a direction finding antenna that is rotatable about a substantially vertical axis to allow further directional location of the source of the interference radiation. The interference computer evaluates the data signals received from the receiver units, and upon detecting an unacceptable interference radiation, the computer determines the location of the interference radiation source and correspondingly provides display information to the display unit.

The apparatus of the present invention provides the advantage that radiation sources generating interference radiation within a sensitive frequency band and having an unacceptably high signal level may be detected immediately upon their activation, regardless whether this takes place before, during or after the flight operation of the aircraft. The apparatus operates completely automatically to carry out its essential functions without imposing any additional duties on the flight crew personnel to operate the apparatus. Once the apparatus automatically provides display information indicating the presence and location of an interfering radiation source, the flight crew personnel are enabled to request a particular passenger to switch off a particular interfering device, without requiring flight crew personnel to search the entire passenger cabin in an effort to locate electronic devices that may be generating an interfering radiation.

According to further detailed aspects of the invention, each receiver unit may further include a frequency scanner, a bus transmitting unit and a bus receiver unit, while the monitoring unit may further include a level matrix, a scanning control unit, and a scanning input unit. The digital signal transmission data pathway connecting the respective receiver units to the monitoring unit may either be an electrical or optical digital data bus, or a wireless transmission pathway established by using signal transmitters and receivers, which may for example be radio or infrared transmitters and receivers. The electrical or optical data bus may be provided by a data bus already existing in the usual operating systems of the aircraft, or may be a particular hard-wired component of the present apparatus that is installed together with and particularly for the present apparatus.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
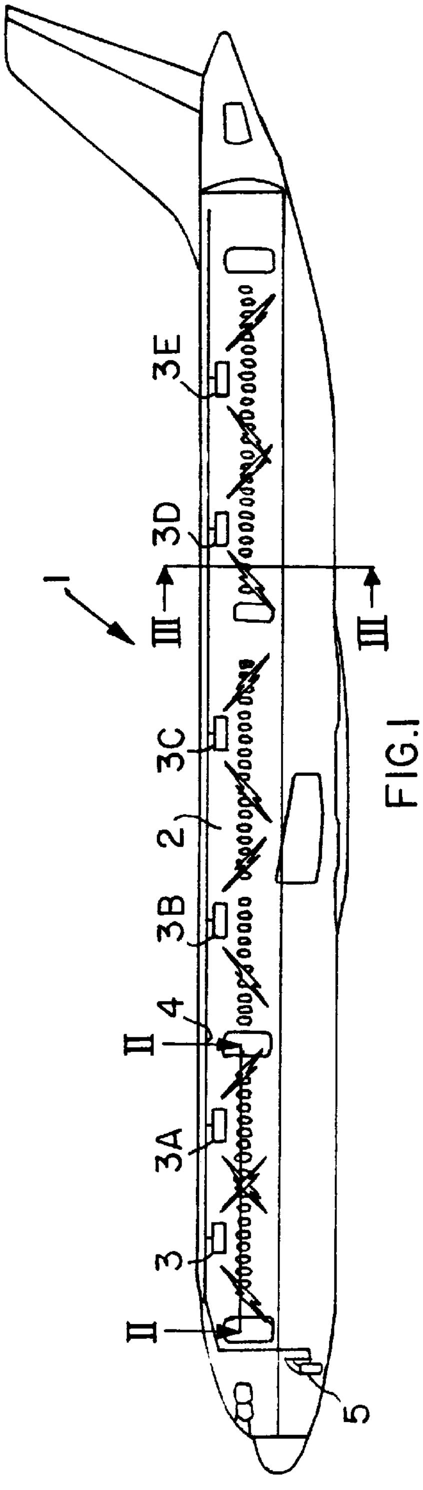
FIG. 1 is a schematic side view of an aircraft fuselage having a passenger cabin therein, showing components of the present apparatus installed therein.

FIG. 1 schematically shows an aircraft fuselage 1 having a passenger cabin 2 therein. The apparatus according to the invention is installed in the passenger cabin 2, and includes a plurality of receiver units 3 arranged distributed along the lengthwise direction in the upper region of the cabin 2, and a central monitoring unit 5 installed in or near the cockpit or a forward crew cabin. A digital data signal transmission pathway connects the several receiver units 3 to the central monitoring unit 5, whereby in the illustrated embodiment this signal transmission pathway is realized by a data bus 4, which may comprise an electrical conductor or an optical fiber data bus. Alternatively, each receiver unit 3 and the monitoring unit 5 respectively include signal transmitter and receiver units, so that the data signal transmission pathway can be realized as a wireless radio link, for example.

Figure 2:
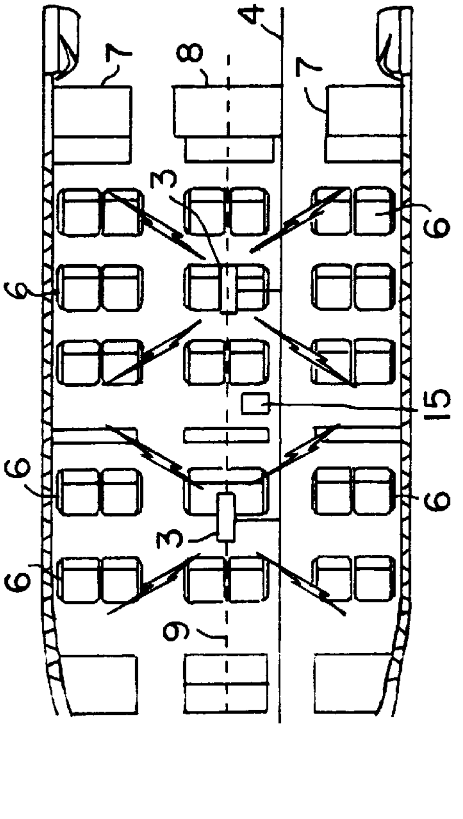
FIG. 2 is a top view of a portion of the cabin of the aircraft that has been broken open or sectioned along the line II—II in FIG. 1.

FIG. 2 is a partial top view of the passenger cabin 2 of FIG. 1, including passenger seats 6 and other cabin installations 7 and 8. In the present illustrated embodiment, the several receiver units 3 are arranged distributed along a line vertically above the lengthwise axis 9 of the fuselage 1. Each receiver unit 3 is capable of receiving and measuring at least the frequency and the signal field strength of an interference radiation signal emitted by an electronic device such as a portable computer 15 that is being used in the cabin. A data signal incorporating or embodying the measured values is transmitted from each receiver 3 to the central monitoring unit 5 over the data bus 4.

Figure 3:
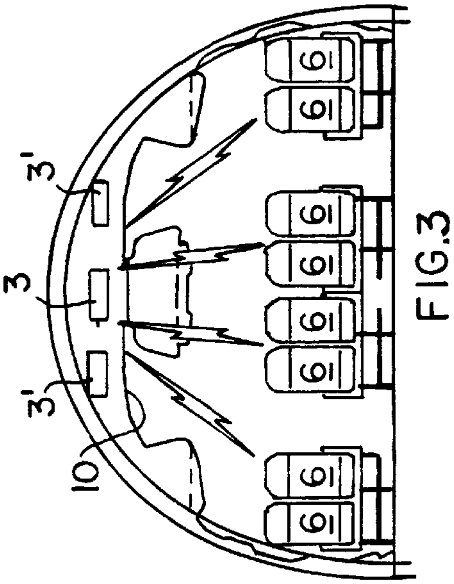
FIG. 3 shows a cross-section through a portion of the aircraft cabin along the line III—III in FIG. 1.

FIG. 3 shows a cross-section through the cabin 2 of the aircraft fuselage 1 shown in FIG. 1, having passenger seats 6 and a representative one of the receiver units 3 visible therein. A cabin ceiling panel 10 forms the finished or decorative ceiling of the cabin 2, whereby the receiver units 3 are arranged above the ceiling 10 for reasons of visual appearance. The material of the cabin ceiling 10 is selected, for example as a synthetic material, so that it does not influence the proper functioning of the receiver units 3 in any way. Namely, the interference radiation signals radiate through the ceiling 10 without being influenced thereby.

FIG. 3 also shows an optional arrangement of additional or alternative receiver units 3' which are laterally displaced from one another, i.e. not arranged directly above the aircraft axis 9 as are the receiver units 3. Thus, the receiver units 3' are arranged laterally spaced apart from one another in a direction parallel to a crosswise pitch axis of the aircraft, and longitudinally spaced apart from one another in a direction parallel to the lengthwise roll axis of the aircraft. The laterally displaced receiver units 3' are similarly connected to the data bus 4 and improve the precision of locating the interfering radiation sources. Namely, the receiver units 3 can essentially only locate the interfering radiation source as being within a particular row of passenger seats 6, because the linearly arranged receiver units 3 do not provide any lateral differentiation for the received interference signals. On the other hand, the receiver units 3' arranged laterally displaced from one another and distributed along the length of the aircraft can provide lengthwise and lateral location information regarding the interfering radiation source.

Figure 4:
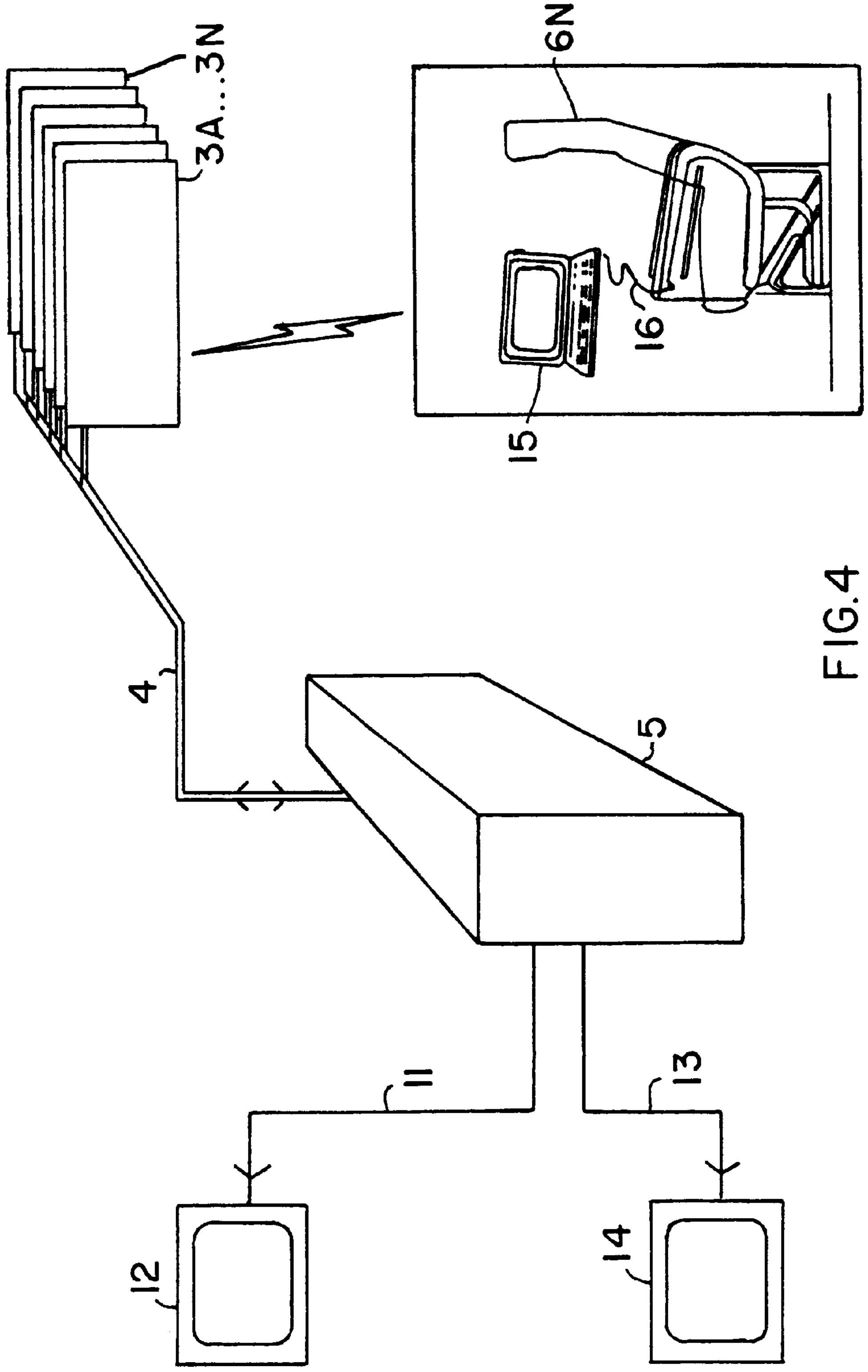
FIG. 4 is a schematic perspective block diagram showing the arrangement including a central monitoring unit and a plurality of receiver units according to the invention.

FIG. 4 is a schematic block diagram representing the arrangement of the central monitoring unit 5 and a plurality of receiver units **3*a* to 3*n* connected to the monitoring unit 5 by the data bus 4. Moreover, an indicator or display unit 12 arranged in the cockpit is connected to the monitoring unit 5 via a data line 11, and an indicator or display unit 14 arranged in the aircraft cabin is connected to the monitoring unit 5 via a data line 13. The information stored within the monitoring unit 5 includes a diagram or other representation of the seating arrangement in the aircraft cabin, as well as the positions of the several individual receiver units 3*a* to 3*n*. This information is used for evaluating the signals received from the receiver units 3*a* to 3*n* and providing respective display signals to the display units 12 and 14**.

FIG. 4 further schematically shows a particular passenger seat **6*n*, whereby a passenger (not shown) seated in this seat is using a portable computer 15 which is powered by being plugged in to the electrical supply net of the aircraft via a power supply cable 16. In the present example, it is assumed that the portable computer 15** is emitting an interfering radiation signal.

The receiver units **3*a* to 3*n* can detect and receive every interfering radiation signal within a sensitive frequency range, and then generate and transmit a corresponding data signal to the monitoring unit 5 via the data bus 4. Each such data signal comprises an identifier that identifies the respective receiver unit 3*a* to 3*n* from which the signal is transmitted, as well as data representing the frequency and the local signal field strength of the interference radiation as received at the respective receiver unit. Thus, the monitoring unit 5 receives such a signal from each one of the receiver units 3*a* to 3*n* that received the particular interference radiation with a signal field strength greater than a prescribed acceptable threshold level. By evaluating and comparing the information provided by the several data signals from the several receiver units 3*a* to 3*n*, the monitoring unit 5 can determine with sufficient precision the location of the center of an interference radiation field, and thus determine the location of the portable computer 15 that is emitting the interfering radiation. For example, using the illustrated arrangement of receiver units 3, the monitoring unit 5 can determine at least the row of seats in which the seat 6*n* and the interfering portable computer 15** are located.

Once the location of the interfering radiation source has been determined, the monitoring unit 5 provides a corresponding video and/or data signal via the data lines 11 and 13 to the cockpit-side display unit 12 and the cabin-side display unit 14. Upon receiving these signals, the display units 12 and 14 emanate an acoustic or visual warning signal indicating that respective information regarding an interfering radiation is available to be called up in the display unit. By carrying out an appropriate operation procedure, for example by actuating a corresponding switch, the flight crew personnel may then call up the interference information on the display unit. The display unit thereupon displays a representation of the seating arrangement with the seat row numbers superimposed thereon, on a corresponding display screen, whereby the seating row including the seat 6N is clearly marked or highlighted. Based on the display information, the flight crew personnel may then locate, in a direct and targeted manner, the passenger who is using the portable computer 15 and request that the computer 15 be switched off.

Figure 5:
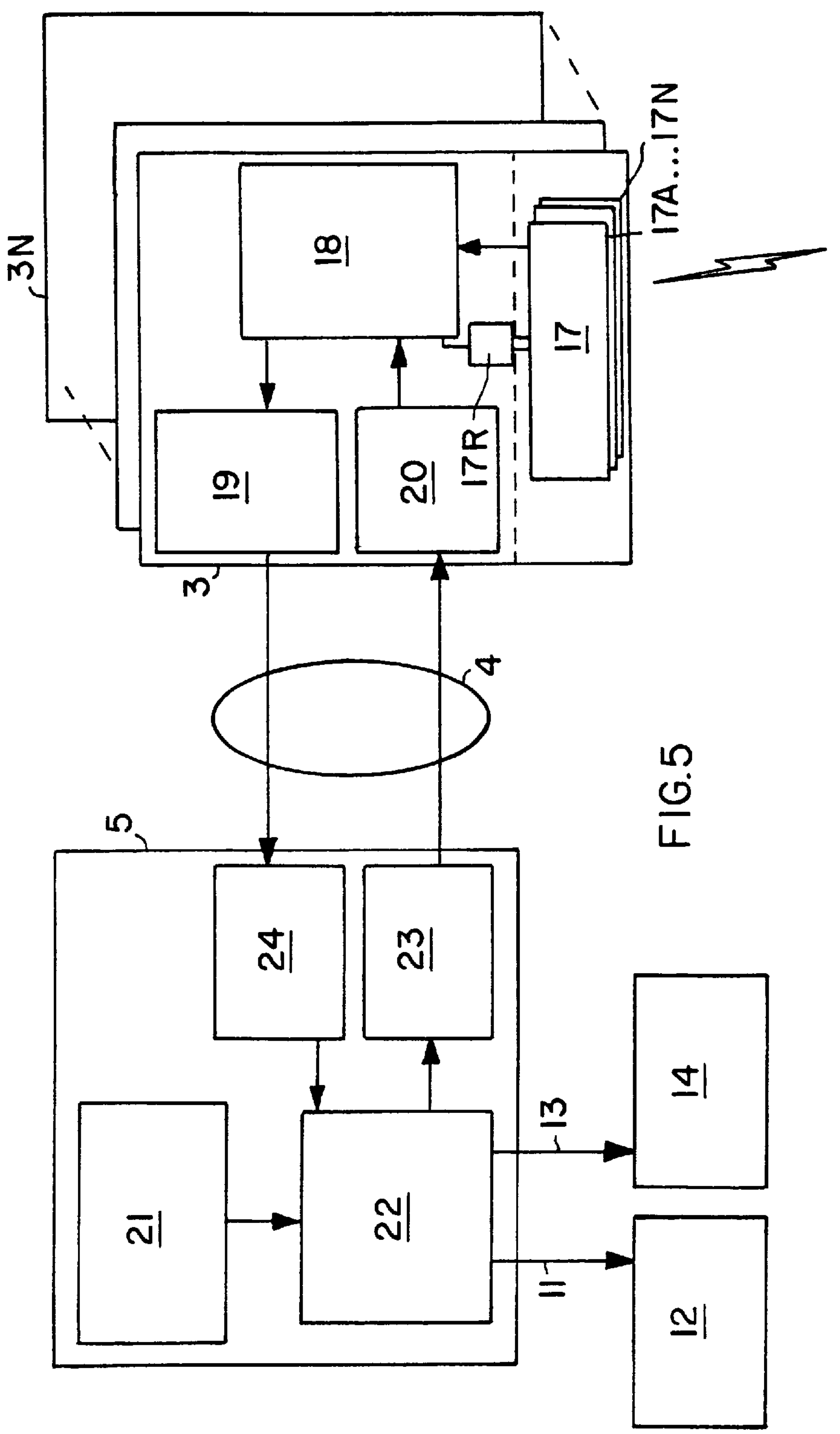
FIG. 5 is a schematic block circuit diagram showing the internal circuitry of the monitoring unit and one receiver unit according to the invention.

FIG. 5 shows the data and information paths of the inventive arrangement, in connection with the internal functional components of the receiver units 3 and the monitoring unit 5. Each receiver unit 3 comprises an antenna 17, a frequency scanner 18, a bus transmitting unit 19, and a bus receiving unit 20. Depending upon the total frequency bandwidth of the frequency range that is to be monitored, each receiver unit 3 may include a plurality of antennas **17*a* to 17*n*** respectively tuned to different individual partial frequency ranges within the total frequency range.

The interference signal received by the antenna or antennas 17 is provided to the frequency scanner 18, which evaluates the received interference signal based on a prescribed or preassigned evaluation characteristic, to determine whether the field strength of the received interference signal exceeds a prescribed threshold value and whether the frequency of the received interference signal falls within a sensitive frequency range. If this is the case, then the frequency scanner 18 provides a corresponding signal to the bus transmitting unit 19, which in turn transmits a signal over the data bus 4 to the monitoring unit 5. This signal includes at least an identifier of the respective receiver unit 3 as well as data representing the frequency and the field strength of the interference radiation as received at the respective receiver unit 3.

The bus receiving unit 20, which is also connected to the data bus 4, receives commands being transmitted by the monitoring unit 5 in the form of prescribed or preassigned evaluation characteristics for the frequency scanner 18, with regard to the above mentioned threshold value, selection of frequency ranges, and if applicable an indication of the scanning resolution that is to be used.

The monitoring unit 5 comprises a level matrix 21, an interference computer 22, a scanning control unit 23 and a scan input unit 24. The level matrix 21 practically embodies or comprises a data bank containing data relating to the various threshold values associated with the individual frequency ranges, and relating to the frequency bands in which the individual frequency ranges are to be sampled. Furthermore, the level matrix 21 contains information regarding conditions under which the above mentioned threshold values may be changed. As a basic example, the threshold values during the take-off and landing phases of a flight may be set relatively low, while the thresholds may be set at a relatively higher level during the cruise flight phase, in view of particularly stringent regulations and restrictions on RF emissions during take-off and landing.

The scan input unit 24 receives and preprocesses the information or data received from the receiver unit 3, and stores these data for an orderly input into the interference computer 22. In turn, the interference computer 22 compares and evaluates the data received from all the receiver units 3 and further compares the data with the information provided by the level matrix 21, and responsive thereto provides a result signal indicating the presence and location of an unacceptable interfering radiation signal, if applicable. For example, if the data signals received from several different receiver units 3 each indicate that an interfering radiation signal having a particular frequency characteristic has been received at each of the several receiver units, then it can be assumed that the same interfering radiation source has generated the radiation that has been received by each of the receiver units, and the differences in the signal strengths of the radiation signal as received at the several receiver units can be used to calculate the location of the radiation source relative to the known locations of the receiver units, with the spacial degree of precision afforded by the particular configuration and arrangement of the receiver units. The corresponding result signal is transmitted over the data lines 11 and 13 to the cockpit-side display unit 12 and the cabin-side display unit 14, where the signals lead to the functions and effect described above in connection with FIG. 4.

The apparatus operates completely automatically, so that any interference radiation sources operating on board the aircraft can be detected and located without active involvement of the flight crew personnel. The only activities to be carried out by the flight crew personnel are to pay attention to the information provided by the display units 12 and 14 and to take appropriate action to deactivate any electronic device that is emitting interfering radiation as indicated by the present apparatus.

The stored threshold values represent corresponding acceptable limits on the interference radiation emissions in any given frequency range. The threshold values can be particularly established and programmed for each respective aircraft based on the particulars of its on-board electronics. In this manner it is achieved that any potential interference radiation signals having a signal level below the respective thresholds, which therefore represent acceptable or inconsequential emissions, are automatically ignored by the apparatus, and thus do not need to be taken into account by the flight crew personnel. Furthermore, passenger convenience is improved, because all electronic devices other than those particular devices determined to be causing unacceptable interference may continue to be used.

In a particular embodiment of the invention, the data bus 4 is a fixed component of the apparatus and is installed in the aircraft together with the apparatus. According to another embodiment of the invention, the receiver units 3 and the monitoring unit 5 are embodied in such a manner that they can cooperate in a problem-free manner with a standard data bus, for example a data bus according to the standard ARINC 429, that is already typically present in the aircraft. Namely, the receiver units 3 and the monitoring unit 5 are simply connected to the preexisting data bus.

Another embodiment of the invention avoids the need of providing a hard-wired connection between the receiver units and the monitoring unit, in that the data transfer between the receiver units 3 and the monitoring unit 5 is carried out in a wireless manner by radio signals or infrared signals for example. In order to achieve this, the receiver units 3 and the monitoring unit 5 respectively include appropriate transmitter/receiver units adapted to transmit radio or IR signals therebetween. This embodiment provides the advantage of a simplified installation, since the laying and connection of data conductors is avoided.

In a further embodiment of the invention, the antenna 17 of each receiver unit 3*a* to 3*n* is embodied as a direction finder antenna connected to a rotational drive 17R and arranged to be rotatable about a substantially vertical axis. With such an arrangement, each receiver unit 3*a* to 3*n* can detect and determine not only the frequency and the signal field strength, but also the direction of incidence of a received interference radiation signal. Accordingly, the receiver units 3*a* to 3*n* would then transmit a corresponding data signal including data representing the direction of incidence of the received interference signal. Although this embodiment involves a greater effort, it provides the advantage that fewer receiver units 3*a* to 3*n* are necessary, while the location of the interfering radiation source can be determined with greater precision. Thus, it should be understood that the apparatus according to the present invention can be so embodied, configured and arranged that the interference computer 22 can determine the location of the interfering radiation source by any known locating method including typical radio location and triangulation.

Although the invention has been described with reference to specific example embodiments, it will be appreciated that it is intended to cover all modifications and equivalents within the scope of the appended claims. It should further be understood that the present disclosure extends to all combinations of any of the various features recited in any of the appended claims.

What is claimed is:

1. A method of detecting and locating a source of an interference radiation on board an aircraft, using an apparatus including a plurality of receiver units each respectively including at least one antenna, a monitoring unit including an interference computer adapted to receive and evaluate digital signals from said receiver units, a digital data transmission pathway linking said receiver units and said monitoring unit and adapted to convey digital signals therebetween, and a display unit connected to an output of said monitoring unit, said method comprising the following steps:

a) receiving an interference radiation in said receiver units with said antennas of said receiver units;

b) in each one of said receiver units, sampling said interference radiation in at least one specified frequency range, and comparing said sampled interference radiation with at least one specified signal level threshold;

c) if said sampled interference radiation exceeds said threshold in said step (b), then preparing and transmitting from said receiver units to said monitoring unit respective digital signals that respectively include at least an identifier of a respective originating one of said receiver units, and first data specifying a respective frequency range and second data specifying a respective signal field strength of said interference radiation as received in said respective originating receiver unit;

d) evaluating and comparing with one another in said monitoring unit said respective digital signals transmitted from said receiver units, and thereby determining a location of a source of said interference radiation; and e) transmitting from said monitoring unit to said display unit information indicating at least said location of said source of said interference radiation.

2. The method according to claim 1, wherein each said receiver unit respectively further includes a frequency scanner, a bus transmitting unit, and a bus receiving unit, each said antenna is connected to a respective receiving input of said frequency scanner, said bus transmitting unit is interposed and connected between a signal output of said frequency scanner and said data transmission pathway, and said bus receiving unit is interposed and connected between said data transmission pathway and a signal input of said frequency scanner, and wherein said sampling and said comparing in said step b) are carried out in said frequency scanner.

3. The method according to claim 2, wherein said data transmission pathway includes an electrical data bus including an electrical conductor connected to said monitoring unit and to said bus transmitting unit and said bus receiving unit of each said receiver unit, and wherein said transmitting in said step c) is carried out by said bus transmitting unit which transmits said digital signals as electrical signals via said electrical data bus.

4. The method according to claim 2, wherein said data transmission pathway includes an optical data bus including an optical conductor connected to said monitoring unit and to said bus transmitting unit and said bus receiving unit of each said receiver unit, and wherein said transmitting in said step c) is carried out by said bus transmitting unit which transmits said digital signals as optical signals via said optical data bus.

5. The method according to claim 2, wherein said data transmission pathway is a wireless radio data transmission pathway, and wherein said transmitting in said step c) is carried out by said bus transmitting unit which transmits said digital signals as radio signals via said wireless radio data transmission pathway.

6. The method according to claim 2, wherein said data transmission pathway is a wireless infrared data transmission pathway, and wherein said transmitting in said step c) is carried out by said bus transmitting unit which transmits said digital signals as infrared signals via said wireless infrared data transmission pathway.

7. The method according to claim 2, wherein each said receiver unit includes a plurality of said antennas that are respectively tuned to different frequency ranges, wherein said receiving in said step a) comprises receiving said interference radiation in said different frequency ranges respectively with said plural antennas of each said receiver unit, wherein said sampling in said step b) is carried out in said different frequency ranges, and wherein said comparing in said step b) is carried out using a plurality of said thresholds respectively for said different frequency ranges.

8. The method according to claims 1, wherein said monitoring unit further includes a level matrix, a scan control unit, and a scan input unit, said level matrix is connected to a memory input of said interference computer, said scan input unit is interposed and connected between said data transmission pathway and a signal input of said interference computer, said scan control unit is interposed and connected between a signal output of said interference computer and said data transmission pathway, and said level matrix comprises a memory module adapted to store information specifying frequency ranges in which said interference radiation is to be detected and respective signal level threshold values for each of said frequency ranges, and wherein said method further comprises storing said information specifying said frequency ranges and said signal level threshold values in said memory module.

9. The method according to claim 1, wherein said antenna is a direction finding antenna adapted and arranged to be rotatable about a substantially vertical axis, and said receiver unit further comprises a rotational drive unit connected to and adapted to rotationally drive said direction finding antenna, and wherein said method further comprises actuating said rotational drive unit so as to rotate said antenna during said step a).

10. The method according to claim 1, further comprising connecting said receiver units and said monitoring unit to a data bus installed in said aircraft, and using said data bus as said data transmission pathway.

11. The method according to claim 1, further comprising arranging said receiver units above a cabin ceiling panel within a fuselage of said aircraft.

12. The method according to claims 11, wherein said arranging is carried out to position said receiver units spaced apart from one another along a line extending parallel to a lengthwise axis of said aircraft.

13. The method according to claim 11, wherein said arranging is carried out to position said receiver units longitudinally spaced apart from one another in a first direction parallel to a lengthwise axis of said aircraft and laterally spaced apart from one another in a second direction parallel to a crosswise pitch axis of said aircraft.

* * * * *